(12) United States Patent
Garg et al.

(10) Patent No.: US 12,525,480 B2
(45) Date of Patent: Jan. 13, 2026

(54) ELECTROSTATIC CHUCK PEDESTAL HEATER FOR HIGH BOW WAFERS

(71) Applicant: ASM IP Holding B.V., Almere (NL)

(72) Inventors: Shubham Garg, Tempe, AZ (US); Jaeyong Cho, Mesa, AZ (US); Amit Mishra, Tempe, AZ (US); Akshay Phadnis, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 210 days.

(21) Appl. No.: 18/138,776

(22) Filed: Apr. 25, 2023

(65) Prior Publication Data

US 2023/0352332 A1 Nov. 2, 2023

Related U.S. Application Data

(60) Provisional application No. 63/335,811, filed on Apr. 28, 2022.

(51) Int. Cl.
*H01L 21/683* (2006.01)
*H05B 3/28* (2006.01)

(52) U.S. Cl.
CPC .......... *H01L 21/6833* (2013.01); *H05B 3/283* (2013.01)

(58) Field of Classification Search
CPC ........... H01L 21/6833; H01L 21/67103; H01L 21/67109; H01L 21/6831; H01L 21/324; H05B 3/283; C23C 16/458; C23C 16/46
See application file for complete search history.

(56) References Cited

U.S. PATENT DOCUMENTS

| | | | |
|---|---|---|---|
| 5,754,391 A * | 5/1998 | Bates | H01L 21/6831 361/234 |
| 6,676,805 B2 | 1/2004 | Tamura | |
| 7,068,489 B2 | 6/2006 | Migita | |
| 7,457,098 B2 | 11/2008 | Nakamura | |
| 7,589,950 B2 * | 9/2009 | Parkhe | H01L 21/6831 279/128 |
| 7,907,384 B2 | 3/2011 | Brown | |
| 8,199,454 B2 | 6/2012 | Koyama | |
| 9,337,067 B2 * | 5/2016 | Roy | H01L 21/6831 |
| 9,666,467 B2 * | 5/2017 | Parkhe | H01L 21/67126 |
| 9,673,025 B2 | 6/2017 | Benjamin | |
| 9,728,437 B2 * | 8/2017 | Tran | H01L 21/67103 |
| 9,888,528 B2 * | 2/2018 | Matsushita | H05B 3/26 |
| 10,079,168 B2 | 9/2018 | Benjamin | |

(Continued)

*Primary Examiner* — Thienvu V Tran
*Assistant Examiner* — Muaamar Qahtan Al-Taweel
(74) *Attorney, Agent, or Firm* — Snell & Wilmer L.L.P.

(57) ABSTRACT

An electrostatic chuck (ESC) pedestal heater that includes a pedestal body and a surface on the pedestal body for receiving a substrate such as a high bow wafer. An electrode is embedded in the pedestal body to selectively generate an electrostatic force. The ESC pedestal heater includes a substrate contact surface that is raised to a height above the surface on the pedestal body and includes an inner seal band, an intermediate seal band, and an outer seal band extending. In the substrate contact surface, main spokes are provided that extend outward from the inner seal band to the outer seal band, and ancillary spokes may be provided between the main spokes in the region between the intermediate and outer seal bands. Additionally, contact areas or dots are provided in the substrate contact surface in the spaces between the bands and spokes.

20 Claims, 5 Drawing Sheets

(56) References Cited

U.S. PATENT DOCUMENTS

| | | | |
|---|---|---|---|
| 10,626,501 B2 * | 4/2020 | Kurano | H01L 21/67103 |
| 10,892,179 B2 | 1/2021 | Benjamin | |
| 11,232,966 B2 | 1/2022 | Thomas | |
| 2016/0148828 A1 * | 5/2016 | Parkhe | H01L 21/67109 |
| | | | 361/234 |
| 2020/0251371 A1 | 8/2020 | Kuno | |
| 2020/0411359 A1 * | 12/2020 | AuBuchon | H01L 21/67126 |
| 2021/0005494 A1 * | 1/2021 | Matyushkin | H01L 21/6833 |

* cited by examiner

FIG. 4B

ELECTROSTATIC CHUCK PEDESTAL HEATER FOR HIGH BOW WAFERS

CROSS-REFERENCE TO RELATED APPLICATIONS

This application is a nonprovisional of, and claims priority to and the benefit of, U.S. Provisional Patent Application No. 63/335,811, filed Apr. 28, 2022 and entitled "ELECTROSTATIC CHUCK PEDESTAL HEATER FOR HIGH BOW WAFERS," which is hereby incorporated by reference herein.

FIELD OF THE DISCLOSURE

The present disclosure relates generally to methods and systems for heating wafers in a wafer processing or reactor system, and, more particularly, to an electrostatic chuck (ESC) pedestal heater, for use in a reaction chamber, that is adapted for use with high bow wafers.

BACKGROUND OF THE DISCLOSURE

Semiconductor processing techniques, including atomic layer deposition (ALD) and chemical vapor deposition (CVD), are often used for forming thin films of materials on substrates, such as silicon wafers. To carry out such processing, reactor systems or tools are used that have a reaction chamber in which a substrate holder is positioned and used for holding wafers during wafer processing steps. In many situations, the substrate holder is provided as the upper portion of a pedestal heater that is used to heat the substrate and includes lift pins to raise and lower the received wafer relative to the upper surface of the substrate holder.

In particular, electrostatic chucks (ESCs) are used as the substrate holder of pedestal heaters in many semiconductor processing applications including etching, CVD, ion implantation, and other processing in reactor system or tools. ESCs are typically made of bulk ceramics and have high resistance to plasma and process gas. The built-in heater ensures high in-plane temperature uniformity and contributes to the semiconductor manufacturing processes that are required to support further miniaturization of semiconductors. An internal electrode in the ESC is embedded to utilize the electrostatic force generated between this structure and the wafer (e.g., a silicon wafer) placed on the ESC surface.

In addition to their use for silicon wafer mounting, ESCs are used to provide flatness correction during the semiconductor manufacturing process as bowing may occur in some wafer-based device designs. For example, NAND flash memory devices have one of the highest number of film stacks, which can lead to high stress on wafers and can cause these wafers to bow. During processing, bowed wafers may not make good thermal contact with the pedestal heater surface, which can create an undesirably large thermal gradient that can cause less desirable deposition quality. Additionally, when deposited, bowed wafers can get higher backside deposition levels that may eventually need to be cleaned resulting in unwanted additional steps being included in device manufacturing involving bowed wafers.

Some ESC designs include minimum contact area (MCA) dots on the chuck's upper surface, and the MCA dots have, in some applications, been useful in flattening a wafer received on the ESC. However, MCA dots are often not efficient in providing uniform clamping force on a wafer or clamping saddle-shaped wafers. Hence, there is a demand for improved ESC pedestal heater designs for use in reactor systems that facilitate more efficient processing involving bowed wafers and that minimize the need for added cleaning steps to remove backside deposition.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments of the description, an electrostatic chuck (ESC) pedestal heater is provided for use in a variety of reactor systems and/or reaction chamber assemblies. The ESC pedestal heater includes a pedestal body and a surface (which may be labeled an ESC surface) on the pedestal body for receiving a substrate (such as, but not limited to a high bow wafer). An electrode is embedded in the pedestal body that operable to selectively generate an electrostatic force between the substrate and the surface to secure the substrate to the pedestal body.

The ESC pedestal heater includes substrate contact surface that is raised to a height above the surface on the pedestal body, and this surface includes: (a) an inner seal band extending at a first diameter about a center of the surface on the pedestal body; (b) an intermediate seal band extending at a second diameter greater than the first diameter about the center of the surface on the pedestal body; and (c) an outer seal band extending at a third diameter greater than the second diameter about the center of the surface on the pedestal body. Additionally, the substrate contact surface further includes a plurality of contact areas disposed in: (a) an intermediate region of the surface on the pedestal body between the inner seal band and the intermediate seal band; and (b) an outer region of the surface on the pedestal body between the intermediate seal band and the outer seal band.

In some exemplary ESC pedestal heaters, the first diameter is in the range of 35 to 60 millimeters (mm), the second diameter is in the range of 150 to 230 mm, and the third diameter is in the range of 270 to 320 mm. The outer seal band may have a width greater than a width of the inner seal band, and the width of the inner seal band may then be greater than a width of the intermediate seal band. The width of the outer seal band can be selected from the range of the range of 3 to 7 mm. The inner seal band and the intermediate seal band each may include a first section arranged proximate to and separated from a second section by a gap. Each of the contact areas can be sized to have an outer diameter in the range of 1.5 to 3.0 mm. Also, the contact areas in each of the intermediate and outer regions may number at least 30, and the contact areas in the intermediate and outer regions may be substantially equidistally spaced apart from neighboring ones of the contact areas.

In some various embodiments of the ESC pedestal heater, the substrate contact surface further includes a set of spokes each extending outward in a linear manner from the inner seal band to the outer seal band. In such embodiments, each of the spokes may have a width in the range of 1 to 3 mm. While the number of spokes may vary, it may be useful for the set of spokes to include six of the spokes each at 60-degree radial offsets from adjacent ones of the spokes. The substrate contact surface further may include a set of ancillary spokes. Each of the ancillary spokes may extend outward in a linear manner from the intermediate seal band to the outer seal band and may be disposed between an adjacent pair of the spokes in the first set of spokes. The set of ancillary spokes may include six or more of the ancillary spokes, and each of the ancillary spokes may have a width in the range of 1 to 3 mm. Further, a ratio of an area of the substrate contact surface to an area of the surface on the pedestal body may be less than 10 percent, such as about 9 percent.

In other embodiments of the description, an electrostatic chuck (ESC) pedestal heater is described that includes a pedestal body including an embedded heater and an integral electrode and also includes a surface on the pedestal body for receiving a substrate. In these embodiments of the ESC pedestal heater, a substrate contact surface is included that is raised to a height above the surface on the pedestal body. The substrate contact surface includes: (a) an inner seal band extending at a first diameter about a center of the surface on the pedestal body; (b) an intermediate seal band extending at a second diameter greater than the first diameter about the center of the surface on the pedestal body: and (c) an outer seal band extending at a third diameter greater than the second diameter about the center of the surface on the pedestal body. Additionally, the substrate contact surface includes a set of spokes each extending outward in a linear manner from the inner seal band to the outer seal band.

The substrate contact surface may further include a plurality of contact areas (e.g., MCA dots or the like) disposed in an intermediate region of the surface on the pedestal body between the inner seal band and the intermediate seal band and in an outer region of the surface on the pedestal body between the intermediate seal band and the outer seal band. Each of the contact areas can be sized to have an outer diameter in the range of 1.5 to 3.0 mm, and the contact areas in each of the intermediate and outer regions may number at least 30. The substrate contact surface further may include a set of ancillary spokes, each extending outward in a linear manner from the intermediate seal band to the outer seal band and each being disposed between an adjacent pair of the spokes in the first set of spokes.

In still other exemplary embodiments, an apparatus is provided for selectively clamping and heating a substrate. The apparatus includes a pedestal heater and, on the pedestal heater, an electrostatic chuck (ESC) that includes an ESC surface for receiving and chucking a substrate using an electrostatic force. A substrate contact surface is included that extends outward from the ESC surface. The substrate contact surface includes a set of linear spokes each spaced apart from and extending radially outward from a center of the ESC surface the inner seal band to the outer seal band. The set of spokes includes six of the spokes each at 60-degree radial offsets from adjacent ones of the spokes, and the substrate contact surface further includes a plurality of contact areas (such as MCA dots or the like) disposed in regions of the ESC surface between pairs of the spokes.

In such embodiments of the ESC pedestal heater, the substrate contact surface can include: (a) an inner seal band extending at a first diameter about a center of the surface on the pedestal body; (b) an intermediate seal band extending at a second diameter greater than the first diameter about the center of the surface on the pedestal body; and (c) an outer seal band extending at a third diameter greater than the second diameter about the center of the surface on the pedestal body. In some heaters, the first diameter is in the range of 35 to 60 millimeters (mm), the second diameter is in the range of 150 to 230 mm, and the third diameter is in the range of 270 to 320 mm. Also, the outer seal band has a width greater than a width of the inner seal band. The width of the inner seal band can be greater than a width of the intermediate seal band, and the width of the outer seal band can be selected from the range of the range of 3 to 7 mm. In some embodiments, the substrate contact surface further includes a set of ancillary spokes each extending outward in a linear manner from the intermediate seal band to the outer seal band and each being disposed between an adjacent pair of the spokes in the first set of spokes. The set of ancillary spokes may include six of the ancillary spokes, and each of the ancillary spokes may have a width in the range of 1 to 3 mm.

All of these embodiments are intended to be within the scope of the disclosure. These and other embodiments will become readily apparent to those skilled in the art from the following detailed description of certain embodiments having reference to the attached figures, the disclosure not being limited to any particular embodiment(s) discussed.

BRIEF DESCRIPTION OF THE DRAWING FIGURES

While the specification concludes with claims particularly pointing out and distinctly claiming what are regarded as embodiments of the disclosure, the advantages of embodiments of the disclosure may be more readily ascertained from the description of certain examples of the embodiments of the disclosure when read in conjunction with the accompanying drawings. Elements with the like element numbering throughout the figures are intended to be the same.

DETAILED DESCRIPTION

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

As described in greater detail below, various details and embodiments of the disclosure may be utilized in conjunction with a reactor system with one or more of the new modular reaction chambers configured for wafer clean/etch processes and/or for a multitude of deposition processes, including but not limited to, ALD, CVD, metalorganic chemical vapor deposition (MOCVD), molecular beam epitaxy (MBE), physical vapor deposition (PVD), plasma-enhanced chemical vapor deposition (PECVD), and plasma etching.

Embodiments of the present technology provide a new design for an electrostatic chuck (ESC) pedestal heater that can be used in a variety of reaction or process chamber assemblies to perform a range of semiconductor processes. Particularly, embodiments of the present ESC design address issues with processing bowed wafers, which can be difficult to clamp or chuck so as to achieve "good" or more uniform thermal contact with the pedestal heater surface. Prior ESC designs often did not provide uniform clamping force on the wafer, which led to reduced quality deposition due to a larger than desired temperature gradient and sometimes led to unacceptably high levels of backside deposition.

In brief, a new ESC design for pedestal heaters is described that provides an ESC surface that has a raised wafer contact surface or platform with a unique pattern adapted to provide a more uniform clamping force on bowed wafers including toward the outer periphery. The raised wafer contact surface includes an array of seal bands combined with spokes, which extend radially outward from the center of the ESC surface, and MCA dots. The pattern of the contact surface or platform facilitates application of a uniform clamping force on bowed wafers during operation of the ESC pedestal heater including energizing the electrode embedded in the ESC. The new pattern allows the ESC pedestal heater to chuck or clamp high bow wafers more successfully when compared with those utilizing only MCA dots.

In the raised surface pattern, the spokes are designed in a way to allow the clamping force to propagate radially outwards upon a received wafer. In addition to an inner seal band, an outer seal band is provided in the raised surface to provide large surface area for clamping the wafer edge, which can significantly reduce backside deposition. An intermediate or middle seal band is included in the raised surface to provide a large surface area to allow the clamping or chucking force to uniformly spread across the wafer and help the clamping force to propagate radially. The MCA dots in the raised surface are, at least in part, arranged between both the spokes and the seal bands to prevent contact between the wafer and the base or main ESC surface. The pattern for the raised surface or platform on the ESC surface also may include cut-outs, such as in one or more of the seal bands (e.g., the inner and intermediate seal bands), to allow trapped gases to escape and prevent or at least reduce wafer sliding on the ESC.

In some applications, a wafer may have a relatively large bow such as 0.4 millimeters (mm) as measured as a distance from an outer edge of the wafer to the ESC surface. For such wafers, it typically is desirable to provide a chucking pressure of at least about 1.0 Torr with an ESC of a pedestal heater, but testing has shown that ESC surfaces with a MCA dot only pattern provide a chucking pressure that is less than 1.0 Torr outside of a relatively small radius, such as outside a radius of 38 mm, whereas the wafer may have a diameter of up to 300 mm or more. In contrast, the new pattern for the raise portion of the ESC surface is designed specifically to enable the chucking force to be propagated toward the wafer edge.

Figure 1:
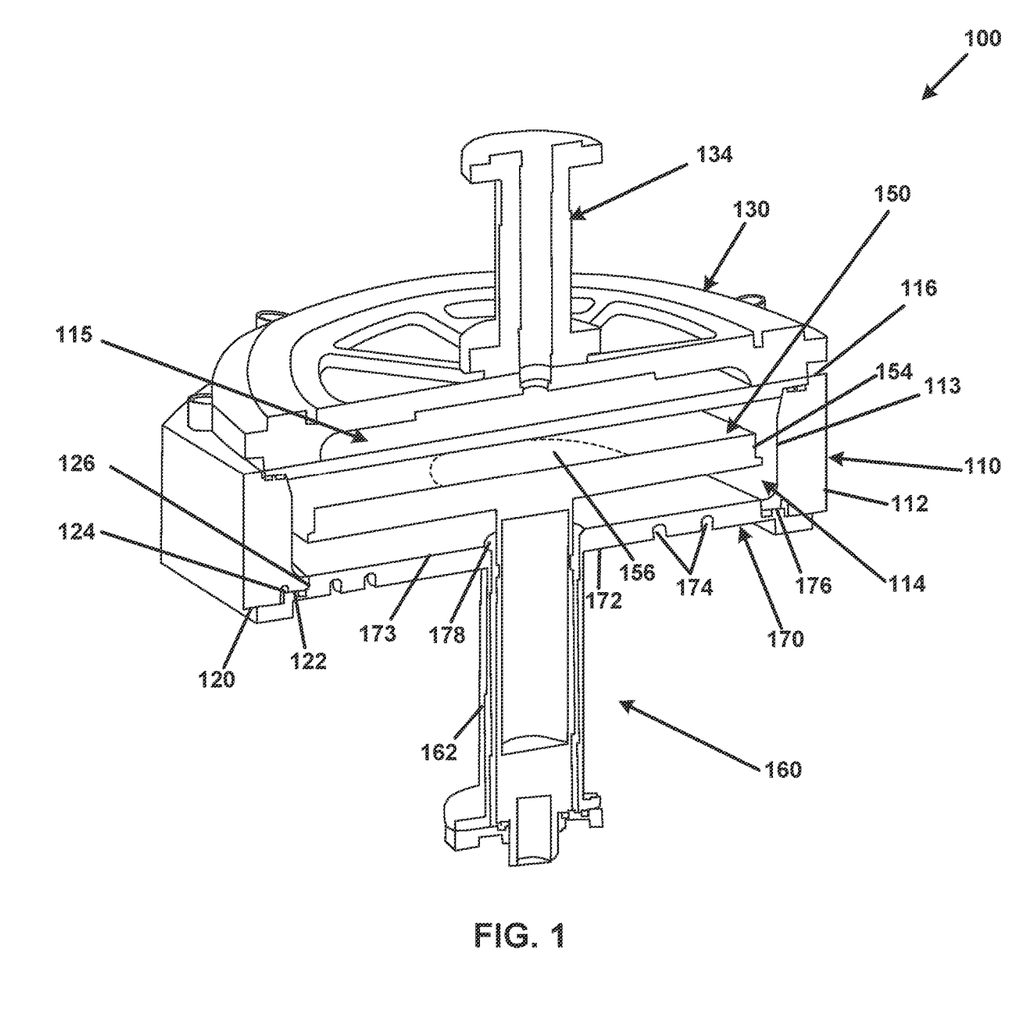
FIG. 1 is a top perspective cross-sectional view of a portion of a reaction chamber assembly with an ESC pedestal heater of the present description.

The ESC pedestal heater with the new ESC surface pattern may be used in a wide variety of reaction chambers. With this in mind, FIG. 1 is a top perspective cross-sectional view of a portion of one exemplary reaction chamber assembly 100 with an ESC pedestal heater of the present description. The reaction chamber assembly 100 is configured for use in a variety of reactor system designs. The reaction chamber assembly 100 includes a reaction chamber 110 with a body 112 defining an inner surface or sidewall 113 and a vault or lower chamber (or lower chamber space) 114. A top surface or sidewall 116 of the body 112 is configured for receiving a bottom wall 115 of the showerhead 130. The ESC pedestal heater 150 includes an ESC with an ESC surface 156 for receiving a wafer within the reaction chamber 110, and the ESC surface 156 includes a raised wafer contact surface or platform (or, more simply, a raised surface or platform) that is described in more detail below.

An upper chamber or processing space is provided above the ESC 154 and enclosed by a showerhead lid or cap 130 of the reaction chamber assembly 100. The assembly 100 further includes a showerhead inlet 134 for providing deposition gases through the lid 130 into the processing space 115. The pedestal heater 150 is included in the assembly 100 for heating the ESC 154, and a wafer is supported upon the ESC surface 156 during processing operations such as during clean/etch, and the heater 150 may take the form of a heater. An integral electrode is embedded in the ESC 154 with electrical power selectively applied to generate an electrostatic force on the ESC surface 156 to create a clamping force to clamp or chuck a wafer upon the ESC surface 156.

Optionally, the reaction chamber assembly 100 includes an interface plate assembly 160 that is adapted to mate with the reaction chamber 110 to define the vault or lower chamber space 114 and to receive and allow the heater 150 to be positioned within the vault or lower chamber space 114. To these ends, the assembly 160 includes sleeve or conduit 162 extending up from a lower flange (that may be used to mate the assembly 160 to the heater 150 or its support collar). The assembly 160 further includes a circular plate 170, with a central opening or hole 178 through which the heater 150 may pass to enter the vault or lower chamber space 114.

The plate 170 includes an exterior or lower surface 172 facing away from the reaction chamber 110 and the heater 150 and an interior or upper surface 173 abutting the space 114 and facing the heater 150 (or its heat element within the space 114). The body 112 of the reaction chamber 110 has a bottom surface or sidewall 120 that is configured to receive the plate 170 within a lower opening or aperture defined by inner lip or ridge 126, which abuts or is proximate to an outer or peripheral edge of the plate 170. To achieve a seal, paired surfaces 122 and 176 are provided on the bottom surface/sidewall 120 of the reaction chamber body 110 and a peripheral lip or extension member of the upper surface 173 of the plate 170. An O-ring or other sealing member (not shown) may be positioned between these two surface 122 and 176 and extend in a continuous manner about plate 170.

To control temperatures of the plate 170 and/or the vault or lower chamber space 114, it may be desirable to provide cooling and heating features. With this in mind, a groove or channel (recessed surface) 124 is provided in the bottom surface/sidewall 120 of the reaction chamber body 110, and a flexible (or other) heater or heating element (not shown in FIG. 1) may be inserted within the groove or channel 124. Typically, the heater and groove 124 would extend about the entire periphery of vault or lower chamber space 114 and acts to heat the body 112 and, in turn, the vault or lower chamber space 114.

To provide cooling to maintain a desired temperature of the plate 170, the plate 170 includes grooves or channels (recessed surfaces) 174 that extend in a circuitous path about the lower surface 172 of the plate 170 on both sides of the heater's central element. Tubing (not shown in FIG. 1) through which coolant (e.g., cooling water) would flow during operation of the assembly 100 may be disposed in the groove/channel 174, and this coolant flow can be used to control the temperature of the plate 170. As noted above, the assembly 100 may be configured for a relatively high upper temperature limit, such as 450° C. The components of the assembly 100 may be fabricated of a variety of materials for use in such a higher temperature application.

Figure 2:
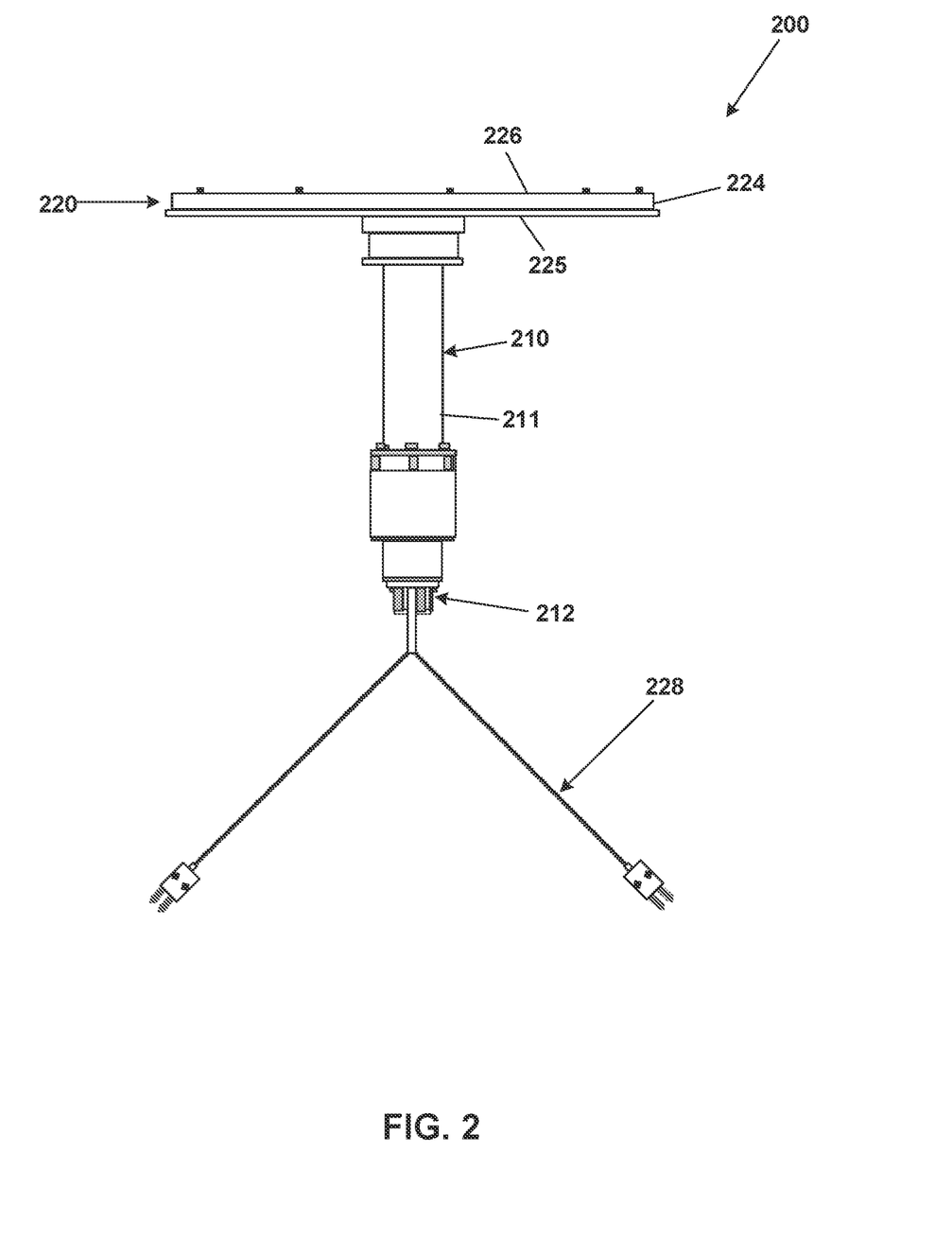
FIG. 2 illustrates a side view of an ESC pedestal heater of the present description such as for use in the reaction chamber shown in FIG. 1.

FIG. 2 illustrates a side view of an ESC pedestal heater 200 of the present description such as for use in a variety of reaction chambers such as the reaction chamber assembly 100 of FIG. 1. As shown, the ESC pedestal heater 200 includes a heater assembly 210 with a cylindrical housing 211 housing heating elements. The ESC pedestal heater 200 may further comprise a heating coil in the pedestal or chuck body 224 that are energized via leads 212 that can be electrically coupled to an energy source (not shown but understood by those skilled in the arts).

The ESC pedestal heater 200 also includes an ESC 220 that includes the chuck or pedestal body 224 coupled on a lower surface to the housing 211 of the heater assembly 210. The chuck or pedestal body 224 further includes an ESC surface 226 that is configured for receiving a wafer or substrate (not shown in FIG. 2) and applying a clamping force to chuck or clamp the wafer or substrate to the ESC surface 226. To this end, electrical leads 228 are included that are used to couple an internal electrode embedded in the body 224 to a source controlled to selectively energize the electrode and generate the clamping force via the ESC surface 226.

Figure 3:
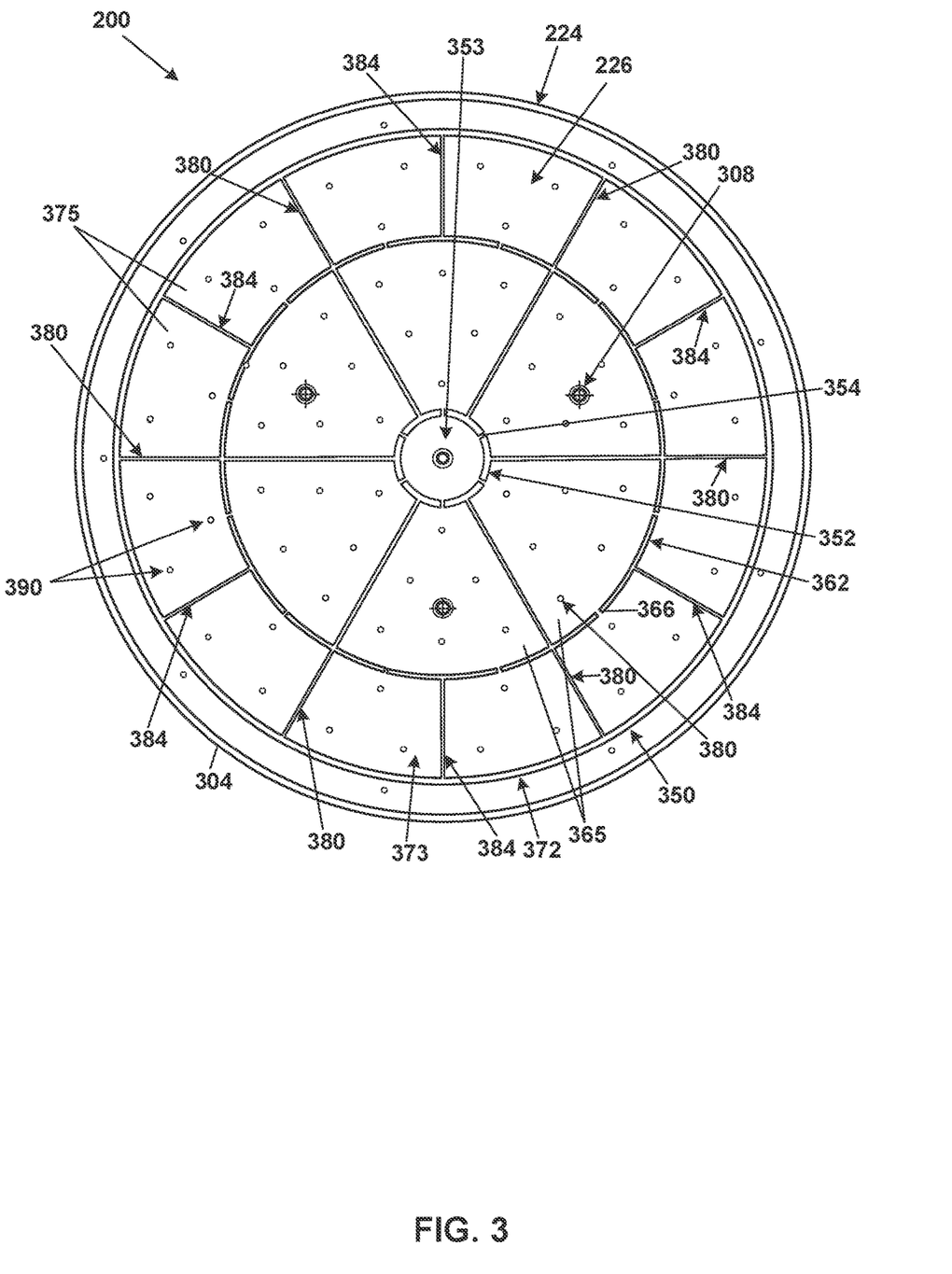
FIG. 3 is a top view of the ESC pedestal heater of FIG. 2 showing an exemplary pattern of a raised wafer (or substrate) contact surface or platform on the ESC surface.
Figure 4A:
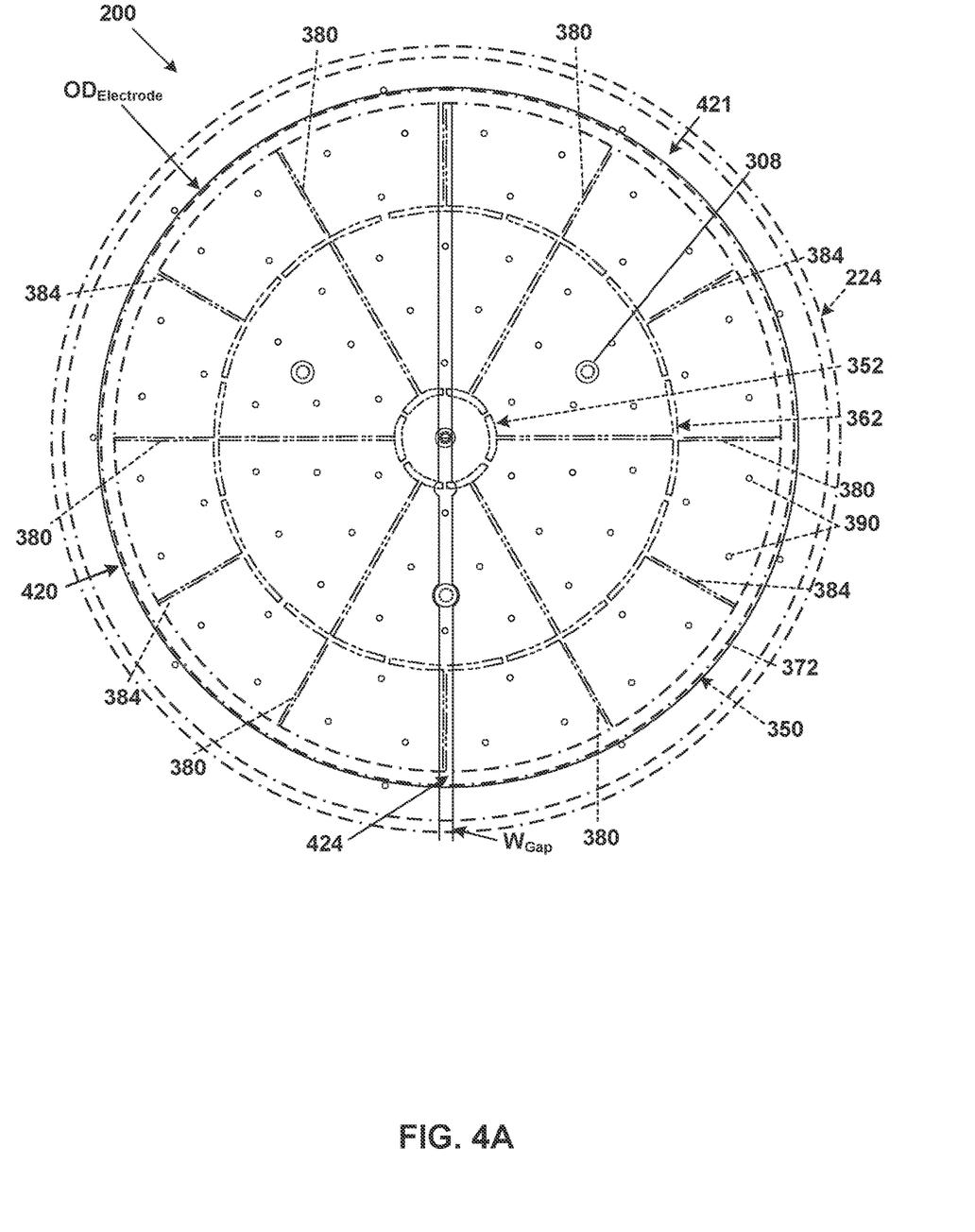
FIGS. 4A and 4B are a top view and a side sectional view, respectively, of the ESC pedestal heater of FIGS. 2 and 3 showing details of one embodiment of an embedded electrode and its location in the pedestal or chuck body relative to the ESC surface.

FIG. 3 is a top view of the ESC pedestal heater 200 of FIG. 2 showing an exemplary pattern of a raised wafer contact surface or platform 350 on the ESC surface 226. As shown, the chuck or pedestal body 224 is configured such that the ESC surface 226 is circular with an outer diameter chosen to suit wafers to be received on the heater 200, e.g., the body 224 may have an outer diameter of 330 mm in some exemplary embodiments. The body 224 is typically formed of an electrically resistive material such as aluminum nitride or the like, includes an integral electrode embedded within the body 224 (see, for example, FIG. 4), and is shown to include a trench or recessed surface 304 about the periphery of the body 224, with a width of 1 to 10 mm or the like. Further, the body 224 includes passageways 308 to define travel paths for lift pins (not shown but understood as useful in many reaction chamber designs) used to control positioning of a received wafer relative to the ESC surface 226.

Significantly, a raised wafer contact surface or platform 350 is formed on the ESC surface 226 and is generally planar (or with top surfaces of each component being planar and parallel to the ESC surface 226 in some embodiments, but, in general, the dots and spokes can be either planar or domed shaped) at a height in the range of 8 to 25 microns from the ESC surface 226, more preferably 8 to 15 microns, and one exemplary embodiment using a height of about 10 microns for the components of the raised wafer contact surface 350. As shown, the contact surface 350 in this example has a pattern that includes an inner seal band 352, an intermediate seal band 362, and an outer seal band 372. Further, the pattern includes a plurality of main spokes (or a first set of radiant spokes) 380 and a plurality of ancillary spokes (or a second set of radiant spokes) 384. Still further, the pattern includes an array or plurality of MCA dots 390. This pattern of raised components act in combination to facilitate propagation of the clamping force, e.g., of at least 1 Torr, generated within the body 224 via electrostatic forces radially outward to be applied more uniformly upon a wafer/substrate received upon the ESC surface 226. The raised wafer contact surface 350 may be provided on the ESC surface 226 using a variety of fabrication techniques, with embossing used in some cases.

The pattern for the raised wafer contact surface 350 provides a contact ratio, as calculated by the area of raised surface 350 divided by the area of the ESC surface 226, within a desired range to control the power requirements to achieve the clamping force. In some embodiments, the contact ratio is selected from the range of 1 to less than about 10 percent while one embodiment implements a contact ratio in the range of 7 to less than 10 percent, such as about 9 percent. Further, in some embodiments, it is desirable that more surface area be provided in the outer seal band than the other seal bands to provide a larger clamping force in parts of the wafer that may be bowed up and away from the ESC surface 226 (e.g., where no contact occurs between the wafer and the raised wafer contact surface 350). Additionally, it may be desirable for the inner seal band 352 to have a greater width than the intermediate seal band 362 to provide more surface area where contact occurs and more clamping force is applied by the ESC 220 to the wafer. Further, as discussed below, the ancillary spokes 384 and MCA dots 390 are included in the pattern to prevent or limit the likelihood of the wafer contacting the ESC surface 226.

The inner seal band 352 may have a width in the range of 2 to 6 mm, with 3 mm used in some embodiments, and the band 352 is circular in shape and may have an outer diameter in the range of 35 to 60 mm, with 44 mm used in some embodiments. The inner seal band 352 encloses an inner region 353 of the ESC surface 226, and one or more cut-outs or gaps 354 are provided in the inner seal band 352 to allow gases trapped between the inner region 353 and a received wafer to escape. In FIG. 3, six cut-outs or gaps 354 are shown that are provided at 60-degree intervals but a smaller or larger number may be used with differing spacing, and each may have a width in the range of 1.5 to 2.5 mm (or more), with 2.0 mm widths used for some implementations of the gaps 354.

The intermediate or middle seal band 362 may have a width in the range of 1 to 5 mm, with 2 mm used in some embodiments, and the band 362 is circular in shape and may have an outer diameter in the range of 150 to 230 mm, with 200 mm used in some embodiments. The middle seal band 362 and inner seal band 352 enclose an intermediate or middle region 363 of the ESC surface 226, and one or more cut-outs or gaps 366 are provided in the intermediate or middle seal band 362 to allow gases trapped between the intermediate region 363 and a received wafer to escape. In FIG. 3, twelve cut-outs or gaps 366 are shown that are provided at 30-degree intervals but a smaller or larger number may be used with differing spacing, and each may have a width in the range of 1.5 to 2.5 mm (or more) with 2.0 mm widths used for some implementations of the gaps 366.

The outer seal band 372 may have a width in the range of 3 to 7 mm, with 4 mm used in some embodiments, and the band 372 is circular in shape and may have an outer diameter in the range of 270 to 320 mm, with about 300 mm (e.g., 298 mm or the like) used in some embodiments and varying with the outer diameter of the body 224 (such as to be some amount less than the body outer diameter such as about 30 mm less in some cases). The outer seal band 372 and middle seal band 362 define an outer region 373 of the ESC surface 226.

The main spokes 380 of the pattern each extend outward linearly between the inner seal band 352 and the outer seal band 372 (i.e., from an outer surface of the band 352 to an inner surface of the band 372). The number of the main spokes 380 generally may vary from 2 to 12 with six being shown that are spread about the center of the body 224 at 60-degree offsets. The main spokes 380 divide the intermediate region 363 into a plurality of zones 365, with at least one of the cut-outs or gaps 466 provided in each zone 365 to allow gas to escape. The width of each of the main spokes 480 may also be varied, with a width in the range of 1 to 3 mm being used in some embodiments and 2 mm used in one exemplary implementation.

The ancillary or outer spokes 384 of the pattern each extend outward linearly between intermediate or middle seal band 362 and the outer seal band 372 (i.e., from an outer surface of the band 362 to an inner surface of the band 372). The number of the ancillary spokes 384 generally may vary from 2 to 12 with six being shown that are spread about the center of the body 224 at 60-degree offsets and at 30-degree offsets from neighboring ones of the main spokes 380. The ancillary spokes 384 along with the main spokes 380 divide the outer region 373 into a plurality of zones 375. The width of each of the ancillary spokes 384 may also be varied, with a width in the range of 1 to 3 mm that typically matches that of the main spokes 380 being useful in some embodiments and 2 mm used in one exemplary implementation.

The pattern for the raised wafer contact surface 350 further includes numerous MCA dots 390, which act to prevent contact between a wafer and the ESC surface 226 at locations between the bands 352, 362, and 372 and between the spokes 380 and 384. The dots 390 may vary in size and number. For example, the outer diameter of each dot may be in the range of 1.5 to 3 mm (such about 2.5 mm), with one embodiment using like-sized dots throughout, while other embodiments use two or more outer diameters within this range for the dots 390. As shown, the pattern for the contact surface 350 includes 73 MCA dots, but a larger or smaller number may be used, such as in the range of 20 to 100 MCA dots 390, with 30 or more typically being provided in each of the intermediate and outer regions 363 and 373, respectively. The MCA dots 390 are generally arranged to be equidistally spaced apart from each other and, in some cases, from the bands 352, 362, and 372 and spokes 380 and 384. Further, as shown, one dot 390 is provided centrally within the inner region 353 while 6 MCA dots 390 are provided in each zone 365 of the intermediate region 363 (for a total of 36 in the intermediate region 363) and 3 MCA dots 390 are provided in each zone 375 of the outer region 373 (for a total of 36 in the outer region 373).

Figure 4B:
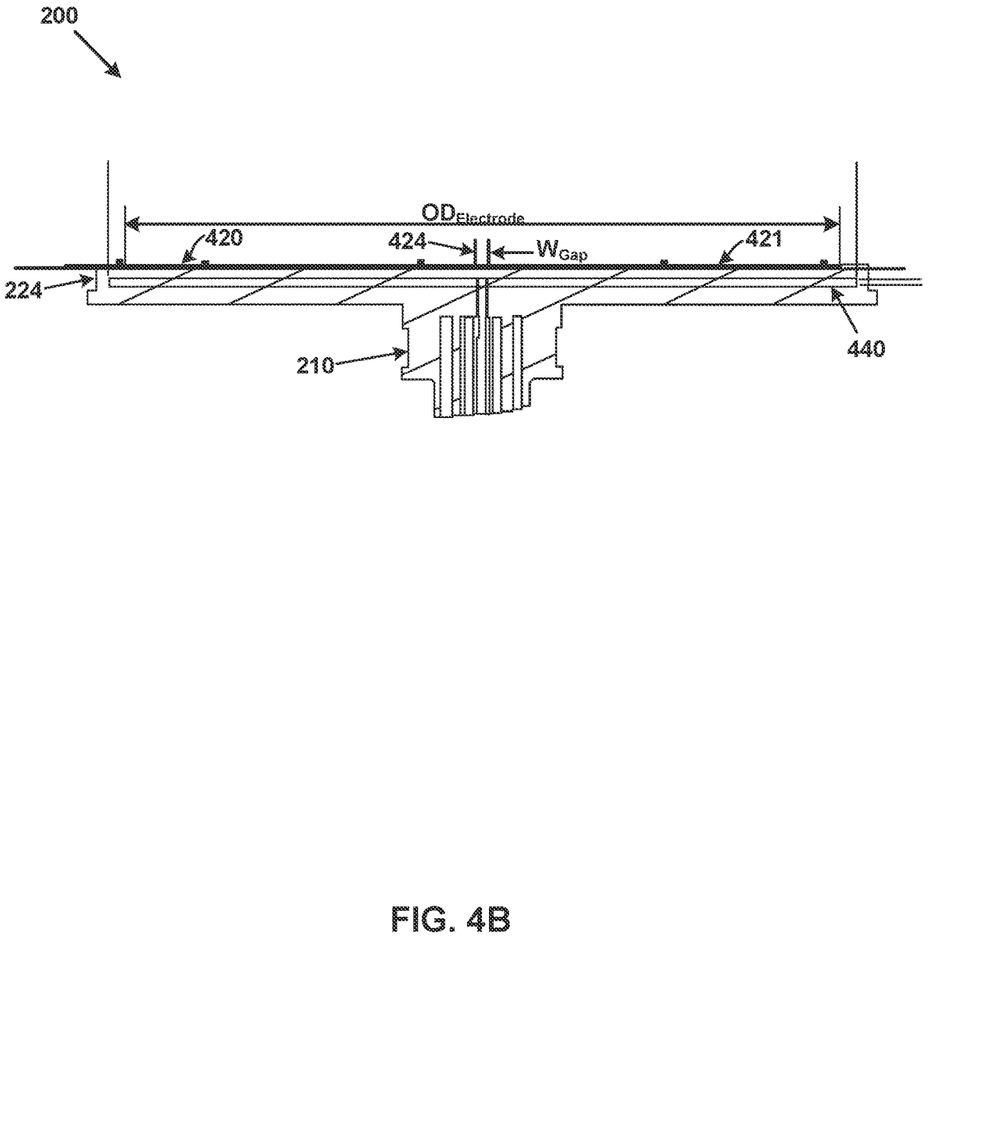

FIGS. 4A and 4B are a top and a side cross-sectional view of the ESC pedestal heater 200 of FIGS. 2 and 3 showing details of one embodiment of an integral and embedded electrode and its location in the pedestal or chuck body 224 relative to the raised wafer contact surface 350 and its components. In FIG. 4A, the electrode is shown to include two half-moon-shaped parts 420, 421 divided by a linear gap 424 (with a width, $wap_{Gap}$, in the range of 4 to 8 mm or the like, with 6 mm used in one exemplary implementation) and the raised wafer contact surface 350 is shown with dashed lines to all the electrode halves or parts 420, 421 to be seen.

The electrode made up of halves or parts 420, 421 is shown to have an outer diameter, $OD_{Electrode}$, when the halves 420, 421 are combined that is some amount less than the outer diameter of the pedestal or chuck body 224 (such as 15 to 30 mm), and that matches or is some amount (e.g., several millimeters) greater than the outer diameter of the outer seal band 372 (such as about 300 mm with an outer seal band outer diameter of 298 mm or the like). Other electrode configurations and designs may be used to implement the pedestal 200. Further, the pedestal or chuck body 224 is shown in FIG. 4B to include a heating coil 440 that is used to heat a wafer received upon and clamped or chucked to the raised wafer contact surface 350 during operations or energizing of the electrode's halves or parts 420, 421.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the disclosure.

Reference throughout this specification to features, advantages, or similar language does not imply that all of the features and advantages that may be realized with the present disclosure should be or are in any single embodiment of the invention. Rather, language referring to the features and advantages is understood to mean that a specific feature, advantage, or characteristic described in connection with an embodiment is included in at least one embodiment of the subject matter disclosed herein. Thus, discussion of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize that the subject matter of the present application may be practiced without one or more of the specific features or advantages of a particular embodiment. In other instances, additional features and advantages may be recognized in certain embodiments that may not be present in all embodiments of the disclosure. No claim element is intended to invoke 35 U.S.C. 112(f) unless the element is expressly recited using the phrase "means for."

The scope of the disclosure is to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. Further, the term "plurality" can be defined as "at least two." As used herein, the phrase "at least one of", when used with a list of items, means different combinations of one or more of the listed items may be used and only one of the items in the list may be needed. The item may be a particular object, thing, or category. Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A, B, and C. In some cases, "at least one of item A, item B, and item C" may mean, for example, without limitation, two of item A, one of item B, and ten of item C; four of item B and seven of item C; or some other suitable combination.

All ranges and ratio limits disclosed herein may be combined. Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Any reference to attached, fixed, connected or the like may include permanent, removable, temporary, partial, full and/or any other possible attachment option. Additionally, any reference to without contact (or similar phrases) may also include reduced contact or minimal contact. In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Additionally, as used herein, "adjacent" does not necessarily denote contact. For example, one element can be adjacent another element without being in contact with that element.

Although exemplary embodiments of the present disclosure are set forth herein, it should be appreciated that the disclosure is not so limited. For example, although reactor systems are described in connection with various specific configurations, the disclosure is not necessarily limited to these examples. Various modifications, variations, and enhancements of the system and method set forth herein may be made without departing from the spirit and scope of the present disclosure. The subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. An electrostatic chuck (ESC) pedestal heater, comprising:
    a pedestal body;
    a surface on the pedestal body for receiving a substrate;
    an electrode embedded in the pedestal body operable to selectively generate an electrostatic force between the substrate and the surface to secure the substrate to the pedestal body; and
    a substrate contact surface that is raised to a height above, and protruding from, the surface on the pedestal body, wherein the substrate contact surface comprises:
        an inner seal band extending circumferentially at a first diameter about a center of the surface on the pedestal body;
        an intermediate seal band extending circumferentially at a second diameter greater than the first diameter about the center of the surface on the pedestal body, wherein there is an intermediate region of the surface on the pedestal body disposed between the inner seal band and the intermediate seal band; and
        an outer seal band extending circumferentially at a third diameter greater than the second diameter about the center of the surface on the pedestal body, wherein there is an outer region of the surface on the pedestal body disposed between the intermediate seal band and the outer seal band,
        wherein at least one of the inner seal band or the outer seal band has a width that is greater than a width of the intermediate seal band,
        wherein the inner seal band, the intermediate seal band, and the outer seal band are configured to contact the substrate when the substrate is disposed on the substrate contact surface.

2. The ESC pedestal heater of claim 1, wherein the first diameter is in the range of 35 to 60 millimeters (mm), the second diameter is in the range of 150 to 230 mm, and the third diameter is in the range of 270 to 320 mm.

3. The ESC pedestal heater of claim 1, wherein the width of the outer seal band is greater than the width of the inner seal band.

4. The ESC pedestal heater of claim 1, wherein the inner seal band and the intermediate seal band each comprises a first section arranged proximate to and separated from a second section by a gap.

5. The ESC pedestal heater of claim 1, wherein the substrate contact surface further comprises a plurality of contact areas disposed in the intermediate region and the outer region of the surface on the pedestal body.

6. The ESC pedestal heater of claim 1, wherein the substrate contact surface further comprises a set of spokes each extending radially outward in a linear manner from the inner seal band to the outer seal band.

7. The ESC pedestal heater of claim 6, wherein the set of spokes includes six spokes each disposed at 60-degree circumferential intervals relative to adjacent spokes.

8. The ESC pedestal heater of claim 6, wherein the substrate contact surface further comprises a set of ancillary spokes each extending radially outward in a linear manner from the intermediate seal band to the outer seal band and each being disposed between an adjacent pair of the spokes in the set of spokes.

9. The ESC pedestal heater of claim 8, wherein the set of ancillary spokes comprises six ancillary spokes and wherein each of the ancillary spokes has a width in the range of 1 to 3 mm.

10. The ESC pedestal heater of claim 1, wherein a ratio of an area of the substrate contact surface to an area of the surface on the pedestal body is less than 10 percent.

11. An electrostatic chuck (ESC) pedestal heater, comprising:
    a pedestal body including an embedded heater and an integral electrode;
    a surface on the pedestal body for receiving a substrate; and
    a substrate contact surface that is raised to a height above, and protruding from, the surface on the pedestal body, wherein the substrate contact surface includes an inner seal band extending circumferentially at a first diameter about a center of the surface on the pedestal body, an intermediate seal band extending circumferentially at a second diameter greater than the first diameter about the center of the surface on the pedestal body, wherein there is an intermediate region of the surface on the pedestal body disposed between the inner seal band and the intermediate seal band, and an outer seal band extending circumferentially at a third diameter greater than the second diameter about the center of the surface on the pedestal body, wherein there is an outer region of the surface on the pedestal body disposed between the intermediate seal band and the outer seal band, and wherein the substrate contact surface further comprises a set of spokes each extending radially outward in a linear manner from the inner seal band to the outer seal band, wherein the inner seal band, the intermediate seal band, the outer seal band, and the set of spokes are configured to contact the substrate when the substrate is disposed on the substrate contact surface.

12. The ESC pedestal heater of claim 11, wherein the set of spokes includes six spokes each disposed at 60-degree circumferential intervals relative to adjacent spokes, and wherein each of the spokes has a width in the range of 1 to 3 mm.

13. The ESC pedestal heater of claim 11, wherein the outer seal band has a width greater than a width of the inner seal band, and wherein the width of the inner seal band is greater than a width of the intermediate seal band.

14. The ESC pedestal heater of claim 11, wherein the inner seal band and the intermediate seal band each comprises a first section arranged proximate to and separated from a second section by a gap.

15. The ESC pedestal heater of claim 11, wherein the substrate contact surface further comprises a plurality of contact areas disposed in the intermediate region of the surface on the pedestal body and in the outer region of the surface on the pedestal body.

16. The ESC pedestal heater of claim 11, wherein the substrate contact surface further comprises a set of ancillary spokes each extending radially outward in a linear manner from the intermediate seal band to the outer seal band and each being disposed between an adjacent pair of spokes in the set of spokes.

17. An apparatus for selectively clamping and heating a substrate, comprising:
   a pedestal heater;
   on the pedestal heater, an electrostatic chuck (ESC) comprising an ESC surface for receiving and chucking a substrate using an electrostatic force; and
   a substrate contact surface extending outward, and protruding, from the ESC surface, wherein the substrate contact surface comprises a set of linear spokes each extending radially outward from a center of the ESC surface, wherein the set of linear spokes includes six spokes each disposed at 60-degree circumferential intervals relative to adjacent spokes, wherein the substrate contact surface further comprises a plurality of contact areas disposed in regions of the ESC surface between pairs of the spokes, and
   wherein the set of linear spokes and the plurality of contact areas are configured to contact the substrate when the substrate is disposed on the substrate contact surface.

18. The apparatus of claim 17, wherein the substrate contact surface includes an inner seal band extending circumferentially at a first diameter about a center of the ESC surface, an intermediate seal band extending circumferentially at a second diameter greater than the first diameter about the center of the ESC surface, wherein there is an intermediate region of the ESC surface disposed between the inner seal band and the intermediate seal band, and an outer seal band extending circumferentially at a third diameter greater than the second diameter about the center of the ESC surface, wherein there is an outer region of the ESC surface disposed between the intermediate seal band and the outer seal band, and wherein the outer seal band has a width greater than a width of the inner seal band.

19. The apparatus of claim 18, wherein the width of the inner seal band is greater than a width of the intermediate seal band.

20. The apparatus of claim 18, wherein the substrate contact surface further comprises a set of ancillary spokes each extending radially outward in a linear manner from the intermediate seal band to the outer seal band and each being disposed between an adjacent pair of the spokes in the set of linear spokes.

* * * * *